(12) United States Patent
Vilermo et al.

(10) Patent No.: US 10,114,415 B2
(45) Date of Patent: Oct. 30, 2018

(54) APPARATUS AND METHOD FOR PROCESSING AUDIO SIGNALS

(71) Applicant: Nokia Technologies Oy, Espoo (FI)

(72) Inventors: Miikka Tapani Vilermo, Siuro (FI); Koray Ozcan, Hampshire (GB); Toni Henrik Mäkinen, Pirkkala (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/485,469

(22) Filed: Apr. 12, 2017

(65) Prior Publication Data

US 2017/0336830 A1 Nov. 23, 2017

(30) Foreign Application Priority Data

Apr. 29, 2016 (GB) .................... 1607458.5

(51) Int. Cl.
  *H04R 1/02* (2006.01)
  *H04R 3/00* (2006.01)
  (Continued)

(52) U.S. Cl.
  CPC .......... *G06F 1/1632* (2013.01); *G10K 11/178* (2013.01); *G10K 11/1786* (2013.01);
  (Continued)

(58) Field of Classification Search
  CPC ...... H04R 2201/02; H04R 3/00; H04R 3/005; H04R 1/02; H04R 1/04; H04R 1/06;
  (Continued)

(56) References Cited

U.S. PATENT DOCUMENTS 7,146,196 B2 12/2006 Chen et al.
7,400,917 B2 7/2008 Wood et al.
(Continued)

FOREIGN PATENT DOCUMENTS

CN 104705957 A 6/2015
EP 2887623 A1 6/2015
(Continued)

OTHER PUBLICATIONS

Extended European Search Report received for corresponding European Patent Application No. 17163196.3, dated Sep. 18, 2017, 6 pages.
(Continued)

*Primary Examiner* — Thang Tran
(74) *Attorney, Agent, or Firm* — Harrington & Smith

(57) ABSTRACT

Apparatus comprises one or more first microphones for providing audio signals from captured acoustic signals; one or more conductive terminals for connection to one or more conductive terminals of an external cover device for receiving audio signals provided by one or more second microphones included in the external cover device; and one or more processors coupled to the one or more first microphones and to the one or more conductive terminals and configured to perform audio processing on the audio signals from the one or more first microphones and/or from the one or more second microphones based on a control input. Cover apparatus comprises one or more microphones and one or more conductive terminals for providing audio signals provided by said one or more microphones to the electronic apparatus.

20 Claims, 14 Drawing Sheets

(51) Int. Cl.
*G06F 1/16* (2006.01)
*H04B 1/3827* (2015.01)
*H04B 1/3888* (2015.01)
*G10K 11/178* (2006.01)
*H03G 5/16* (2006.01)
*A45C 11/00* (2006.01)
*H04M 1/04* (2006.01)
*H04M 1/725* (2006.01)

(52) U.S. Cl.
CPC ........... *H03G 5/165* (2013.01); *H04B 1/3827* (2013.01); *H04B 1/3888* (2013.01); *H04R 1/02* (2013.01); *A45C 2011/002* (2013.01); *G10K 2210/1081* (2013.01); *G10K 2210/3055* (2013.01); *H04M 1/04* (2013.01); *H04M 1/72527* (2013.01)

(58) Field of Classification Search
CPC .. H04B 1/3805; H04B 1/3822; H04B 1/3827; H04B 1/3888; H04M 1/04; H04M 1/72527; A45C 2011/002; G06F 1/1632; G10K 11/178; G10K 11/1786; G10K 2210/1081; G10K 2210/3055; H03G 5/165
See application file for complete search history.

(56) References Cited

U.S. PATENT DOCUMENTS

| | | | |
|---|---|---|---|
| 8,233,637 B2 | 7/2012 | Phelps et al. | |
| 8,774,875 B1 | 7/2014 | Halferty et al. | |
| 9,055,371 B2 | 6/2015 | Tammi et al. | |
| 2005/0110874 A1* | 5/2005 | Song | H04M 1/656 348/207.99 |
| 2009/0116658 A1 | 5/2009 | An et al. | |
| 2009/0196429 A1* | 8/2009 | Ramakrishnan | H04R 3/005 381/26 |
| 2010/0100374 A1* | 4/2010 | Park | G10L 21/0208 704/226 |
| 2011/0287726 A1 | 11/2011 | Huang | |
| 2012/0172090 A1 | 7/2012 | Capps | |
| 2013/0044884 A1 | 2/2013 | Tammi et al. | |
| 2013/0259250 A1* | 10/2013 | Nicholson | G10K 11/1782 381/71.6 |
| 2013/0301846 A1* | 11/2013 | Alderson | H04R 3/002 381/71.7 |
| 2013/0343572 A1 | 12/2013 | Lee et al. | |
| 2014/0093095 A1 | 4/2014 | Slotte et al. | |
| 2014/0192259 A1* | 7/2014 | Holz | H04N 5/23241 348/372 |
| 2014/0341388 A1 | 11/2014 | Goldstein et al. | |
| 2015/0018132 A1 | 1/2015 | Lovelace et al. | |
| 2015/0078606 A1* | 3/2015 | Zhang | H04M 1/035 381/365 |
| 2015/0189058 A1 | 7/2015 | Hwang | |
| 2015/0296294 A1* | 10/2015 | Paquier | G10L 21/0216 381/71.1 |
| 2016/0044410 A1 | 2/2016 | Makinen et al. | |

FOREIGN PATENT DOCUMENTS

| | | |
|---|---|---|
| WO | 2014/043282 A1 | 3/2014 |
| WO | 2014/168344 A1 | 10/2014 |

OTHER PUBLICATIONS

"iPhone 6 / 6s Smart Battery Case—Charcoal Grey", Apple.Com, Retrieved on Mar. 23, 2017, Webpage available at: http://www.apple.com/uk/shop/product/MGQL2ZM/A/iphone-6-6s-smart-battery-case-charcoal-grey.

"Speaker case", ZAGG, Retrieved on Mar. 23, 2017, Webpage available at : http://www.zagg.com/us/en_us/cases/iphone-6-case/speaker-case.

"Discover and save creative ideas", Pinterest, Retrieved on Jan. 28, 2016, Webpage available at : https://www.pinterest.com/pin/527765650053898866/.

"Vysk Phone Cases Provide Physical, Encrypted Security", Tom's guide, Retrieved on Mar. 23, 2017, Webpage available at : http://www.tomsguide.com/us/vysk-smartphone-case-preview,news-19091.html.

Search Report received for corresponding United Kingdom Patent Application No. 1607458.5, dated Sep. 15, 2016, 6 pages.

* cited by examiner

APPARATUS AND METHOD FOR PROCESSING AUDIO SIGNALS

FIELD

This invention relates generally to an apparatus and methods for processing audio signals, particularly audio signals produced by one or more microphones associated with a mobile processing apparatus.

BACKGROUND

It is known to provide mobile audio-capture devices, incorporating one or microphones. Examples include mobile telephones, tablet computers, digital cameras, Virtual Reality (VR) cameras and so on. Typically, these include one or more microphones mounted on the device body and connected to a processor for audio processing, usually under software control, for storage and/or output in one of a number of available formats.

Users wish to have different features in their mobile devices. In the context of audio, some users only use their mobile telephone for voice telecommunications. Others use their telephone for video conferencing, for recording concerts and/or recording video clips. Different use cases require different audio considerations. However, it is not practically feasible to provide multiple microphones, particularly suited to all potential use cases, in a mobile device.

Whilst it is possible to connect additional, external, microphones to mobile devices, these are in a separate housing that is not conveniently carried or compact. Additionally, the external microphones tend not to incorporate processing and/or communication with the mobile device in order to improve or optimise audio quality.

SUMMARY

A first aspect of this specification provides apparatus comprising:
  one or more first microphones for providing audio signals from captured acoustic signals;
  one or more conductive terminals for connection to one or more conductive terminals of an external cover device for receiving audio signals provided by one or more second microphones included in the external cover device; and
  one or more processors coupled to the one or more first microphones and to the one or more conductive terminals and configured to perform audio processing on the audio signals from the one or more first microphones and/or from the one or more second microphones based on a control input.

The control input may be a user control input provided through a user interface of the apparatus.

The control input may be provided by the one or more processors responsive to detecting distortion in the audio signals provided by the one or more first microphones and/or the one or more second microphones. The or each processor may be configured responsive to receiving the control input to turn off or attenuate the audio signals provided from the one or more first and/or second microphones which produce the distortion and to enable or amplify signals from the other.

The control input may be provided by the one or more processors responsive to identifying the connection of an external cover device, wherein the or each processor is configured responsive to receiving the control input to perform audio processing on the audio signals particular to the external cover device.

The or each processor may be configured to perform audio processing on the audio signals dependent on physical attributes of the external cover device.

The or each processor may be configured to identify physical attributes of the external cover device by means of signal analysis of the audio signals received from either or both of the first and second microphones.

The or each processor may be configured to identify the external cover device by receiving an identifier from the external cover device.

The apparatus may further comprise a memory storing plural sets of cover device identifiers in correspondence to plural audio processing algorithms, and the one or more processors may be configured to perform audio processing on the audio signals using one or more of the algorithms which correspond to the identified external cover device.

The or each processor may be configured to process the signals received from the one or more first microphones differently from the signals received from the one or more second microphones. The or each processor may be configured to amplify or attenuate the signals received from the one or more first microphones relative to the signals received from the one or more second microphones. The or each processor may be configured to process one of the audio signals from the first and second microphones as a primary signal and the other as a noise-cancelling signal.

The or each processor may be configured to modify one or both of the audio signals from the first and second microphones dependent on their relative positions.

The apparatus may be a mobile telephone or tablet computer.

A second aspect of the specification provides a cover apparatus for removable attachment to an electronic apparatus as above, the cover apparatus comprising one or more microphones and one or more conductive terminals for providing audio signals provided by said one or more microphones to the electronic apparatus.

The cover may comprise a rear wall and one or more perimeter walls upstanding from the rear wall for mechanical attachment to the electronic apparatus, and the one or microphones of the cover apparatus may be carried by the rear wall. The cover apparatus may be further configured to store and transmit to the electronic apparatus data indicative of its identity or attributes thereof.

The cover apparatus may further comprise one or more processors configured to receive audio signals from the electronic apparatus and to perform audio processing on said audio signals from the electronic apparatus and audio signals from the one or more microphones on the cover apparatus.

A third aspect of the specification provides apparatus comprising:
  a cover for removable attachment to the exterior of an electronic apparatus;
  one or more microphones on the cover for providing audio signals from captured acoustic signals;
  one or more conductive terminals on the cover for connection to one or more conductive terminals of an electronic apparatus for providing audio signals provided by the one or more microphones to the electronic device.

The cover may comprise a rear wall and one or more perimeter walls upstanding from the rear wall for mechanical attachment to the electronic apparatus, and the one or more microphones may be carried by the rear wall.

The apparatus may be configured to store and transmit to the electronic apparatus data indicative of its identity or attributes thereof.

The apparatus may further comprise one or more processors configured to receive audio signals from the electronic apparatus and to perform audio processing on said audio signals from the electronic apparatus and audio from the one or more microphones on the cover.

A fourth aspect of the specification provides apparatus comprising:
- one or more first microphones for providing audio signals from captured acoustic signals;
- one or more conductive terminals for connection to one or more conductive terminals of an external cover device for receiving audio signals provided by one or more second microphones included in the external cover device;
- one or more processors coupled to the one or more first microphones and to the one or more conductive terminals; and
- one or more memories having stored non-transiently therein machine-readable instructions that when executed by the one or more processors cause the one or more processors to perform audio processing on the audio signals from the one or more first microphones and/or from the one or more second microphones based on a control input.

BRIEF DESCRIPTION OF THE DRAWINGS

Exemplary embodiments of the specification will now be described, by way of non-limiting example, with reference to the accompanying drawings, in which.

DETAILED DESCRIPTION OF PREFERRED EMBODIMENTS

Embodiments herein relate to mobile audio-capture devices including, but not limited to, mobile telephones, smart phones, tablet computers, laptop computers, e-readers, digital cameras, video cameras and VR cameras. In general, the embodiments relate to portable audio-capture devices. Such devices include at least one microphone and at least one processor for processing the digitised audio, usually under software control. In overview, the embodiments describe devices and methods utilising interaction between such a device and a cover, e.g. a protective accessory cover, which cover (in only certain embodiments) carries one or more microphones and/or audio signal processing capability for enhancing the functionality of the mobile device.

In the context of this specification, the term 'cover' can refer to any separate body of material which is adapted mechanically to attach to a mobile device. It is not essential that the cover, when attached, covers or encloses the mobile device entirely, or even substantially. Indeed, a common cover design is one that, when attached, covers only the rear side of the device and two or more of the edges. Usually the cover will include recesses and/or apertures in alignment with control buttons of the device to which it attaches. The term can be considered interchangeable with case or shell. The cover can attach to the device using any known means, including by providing a pocket or pouch portion, by providing one or more resilient clips at edges thereof, by magnetism and so on.

The audio capture device described in the following embodiments is a mobile telephone, specifically a smartphone. For convenience, the general term 'terminal' or 'mobile terminal' will be used, and such terms are intended to encompass tablet computers, mobile gaming consoles and other handheld devices.

First Embodiment

Figure 1:
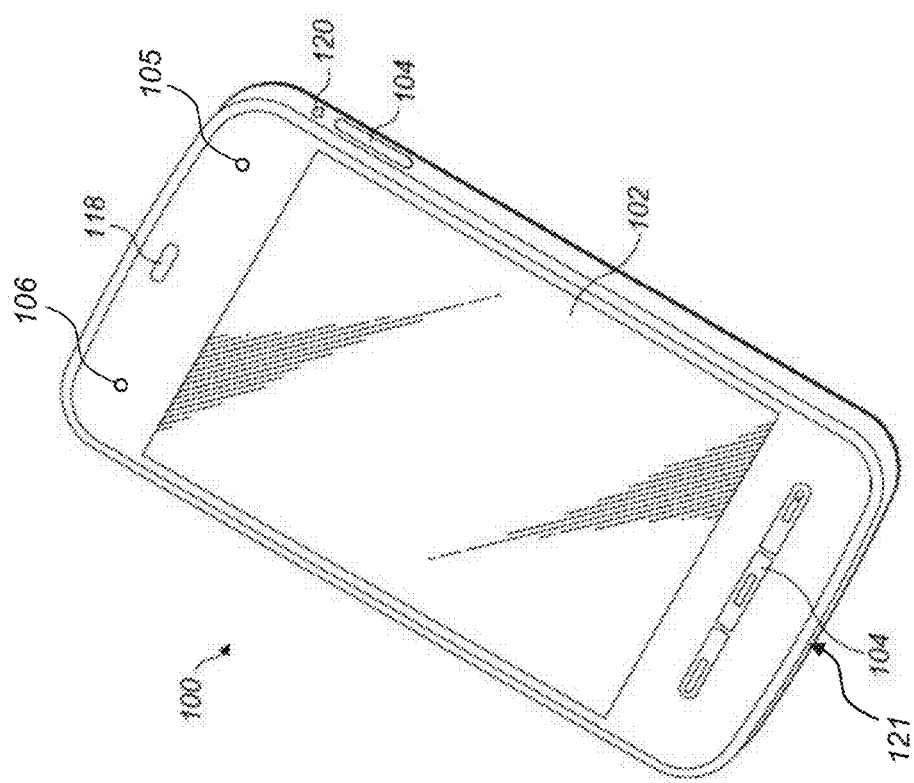
FIG. 1 is a perspective view of a mobile terminal in accordance with embodiments.

Referring to FIG. 1, in a first embodiment a terminal 100 is provided. The terminal 100 has a touch sensitive display 102, hardware keys 104, a first microphone 105, a second microphone 106, a speaker 118 and a headphone port 120. At the lower edge, a connector port 121 is provided, which can be used for one or both of charging the internal battery and the transmitting and receiving of data signals. The first microphone 105 is provided below the display 102, typically where the user's mouth is located in voice mode. The first and second microphones 105, 106 are located on opposite sides of the front face of the terminal 100. The transmission of signals can also be referred to as sending, communicating or providing, and references in the following to transmit, transmitted etc. can be substituted with send, communicate, provide, sent, communicated, provided etc. accordingly.

Figure 2:
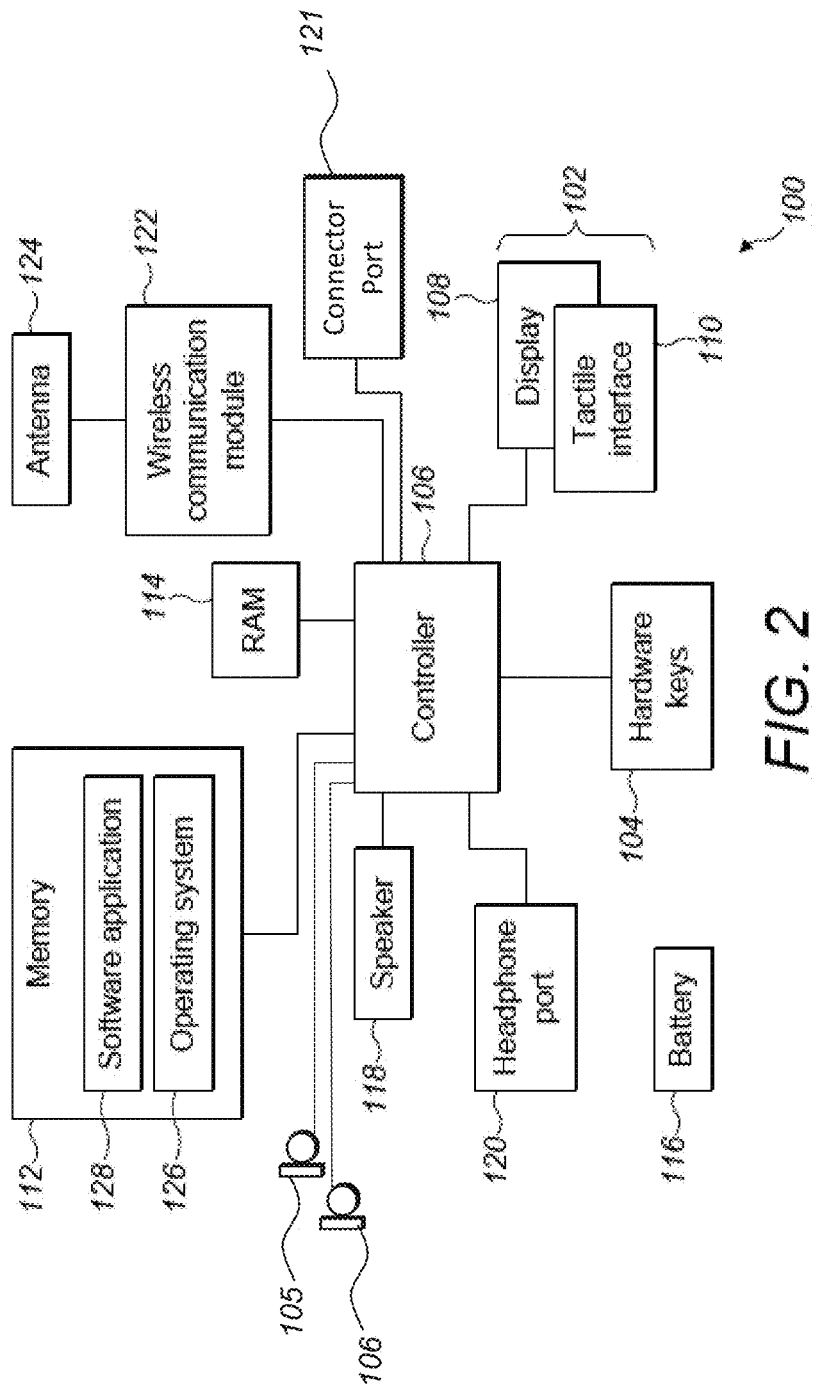
FIG. 2 is a schematic diagram illustrating components of the FIG. 1 terminal and their interconnection.

FIG. 2 shows an example schematic diagram of components of the terminal 100. The terminal 100 has a controller 106, the touch sensitive display 102 comprised of a display part 108 and a tactile interface part 110, the hardware keys 104, the first and second microphones 105, 106, a memory 112, RAM 114, a speaker 118, the headphone port 120, the connector port 121, a wireless communications module 122, an antenna 124 and a battery 116. The controller 106 is connected to each of the other components (except the battery 116) in order to control operation thereof.

The memory 112 may be a non-volatile memory such as read only memory (ROM) a hard disk drive (HDD) or a solid state drive (SSD). The memory 112 stores, amongst other things, an operating system 126 and may store software applications 128. The RAM 114 is used by the multi-core processor 106 for the temporary storage of data. The operating system 126 may contain code which, when executed by the controller 106 in conjunction with RAM 114, controls operation of each of the hardware components of the terminal.

The controller 106 may take any suitable form. For instance, it may be a microcontroller, plural microcontrollers, a processor, or plural processors.

On the memory 112, the software application 128 is arranged to process audio signals in accordance with one or more audio processing algorithms, as will be explained. More specifically, the software application 128 is arranged to receive audio signal data from the one or more 'local' microphones 105, 106 and also audio signal data from one or more external microphones carried on an accessory cover when attached to the terminal 100. Data communications with the cover is performed through the connector port 121, i.e. a physical port. It should be appreciated that other forms of interface between the terminal 100 and an external cover can be used, e.g. wireless communications.

Figure 3:
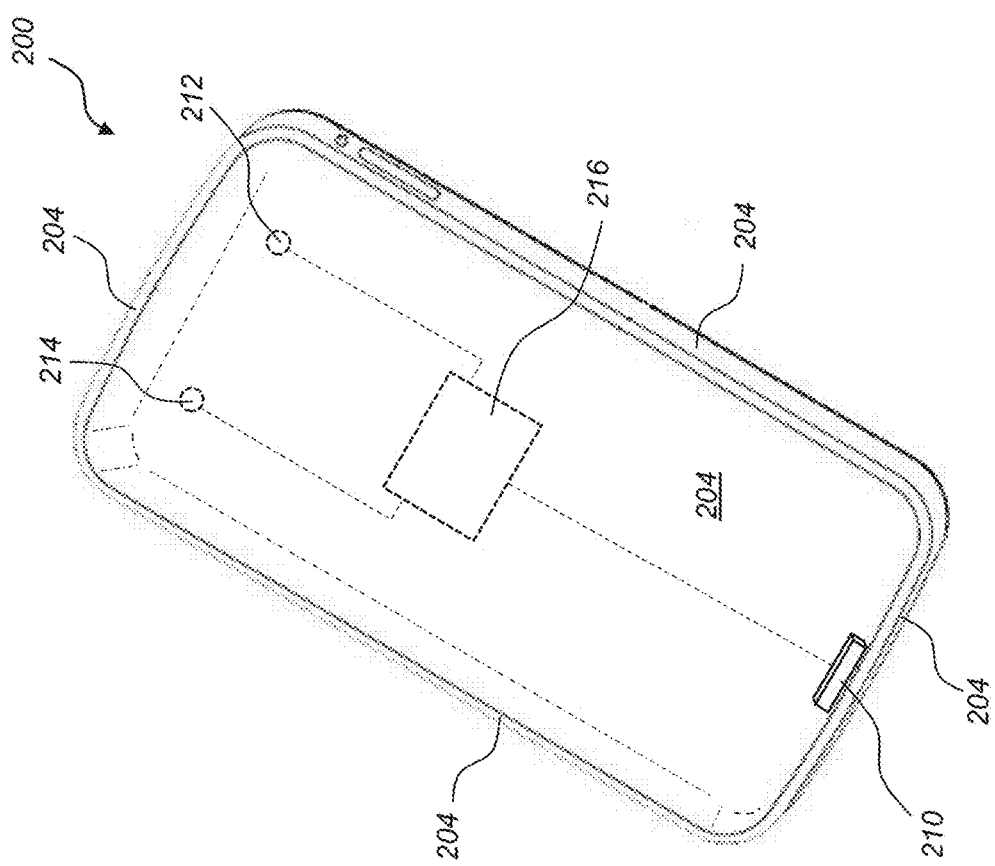
FIG. 3 is a front perspective view of a cover accessory for the FIG. 1 terminal.

FIG. 3 shows an example of a cover 200. The cover 200 comprises a body, shaped and dimensioned substantially to conform to the shape of the terminal 100, having a major rear wall 202, and four perimeter walls 204. A docking connector 210 is mounted to the inside of the lower perimeter wall. In order to attach the terminal 100 to the cover 200, the port 121 of the terminal 100 is placed over the docking connector 210 and electrically/mechanically engaged thereto. The terminal 100 is then secured within the perimeter walls 204 which may be shaped to clip and retain the terminal in place.

One or more 'external' microphones 212, 214 are provided on the cover body, spaced apart on the rear wall 202 at opposite sides. The external microphones 212, 214 may be present fitted within the cover, that is buried within the cover body. In this way, the microphones are not visible. Sound outlets for the microphones 212, 214 may be so small as to be invisible or barely visible to the human eye. Suitable configurations are disclosed in US 2014/0093095 and US 2015/018132, the disclosures of which are incorporated by reference. Alternatively, the external microphones 212, 214 may be provided on the surface of the cover body.

Additionally, an audio processor 216 is provided in or on the cover, preferably mounted on a circuit board concealed within the rear wall 202 as shown. The audio processor 216 may have associated circuitry and components, but in essence, runs under software control to perform audio processing in accordance with predefined instructions. Examples of audio processing methods that may be performed by the audio processor 216 are described in US 2016/0044410 A1 the entire contents of which are incorporated herein by reference. The docking connector 210 is also connected to the audio processor 216.

Figure 4:
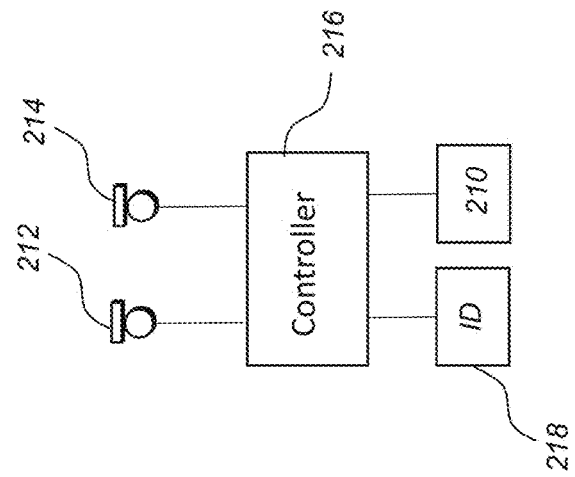
FIG. 4 is a schematic diagram illustrating components of the FIG. 3 cover accessory and their interconnection.

FIG. 4 shows an example schematic diagram of components of the cover 200. It includes the audio processor 216, the first and second external microphones 212, 214, the docking connector 210 and, additionally, a memory 218 storing an identifier unique to the cover type, which may for example be its product code, serial number or other information which make it possible to distinguish attributes of the cover over different covers.

Additional components such as one or more batteries and/or speakers may also be provided, but are not shown in the Figure.

Enhanced audio functionality is provided by connecting the terminal 100 to the cover 200, by virtue of the additional microphones 212, 214 and processing based on attributes of the cover 200. When the cover 200 is attached, its identifier stored in memory 218 is read by the terminal 100. At the terminal 100, the software application 128 receives the identifier and uses this to access an audio processing algorithm particular to attributes of the cover 200. Processing of the audio signals received from each microphone is subsequently performed using said accessed algorithm.

In this sense, there is control input to the processor, which may be considered the cover identifier and/or a signal indicating the audio processing algorithm to use.

Such attributes are typically physical attributes, for example one or more of: the number of external microphones 212, 214, their spatial locations on the cover 200, thickness of the cover, location of apertures on the cover, dimensions of apertures on the cover, and so on. In this respect, it will be understood that the cover 200, and the microphones 212, 214 in the cover will cause changes to the audio processing algorithm conventionally used without the cover attached.

In the terminal 100, the memory 112 may store a database representing a plurality of cover identifiers corresponding to different attachable covers, each having different physical attributes. The terminal 100 is in use therefore able to switch between audio processing algorithms automatically upon detecting connection of a particular cover, and reverts back to its conventional processing when detached.

Figure 5:
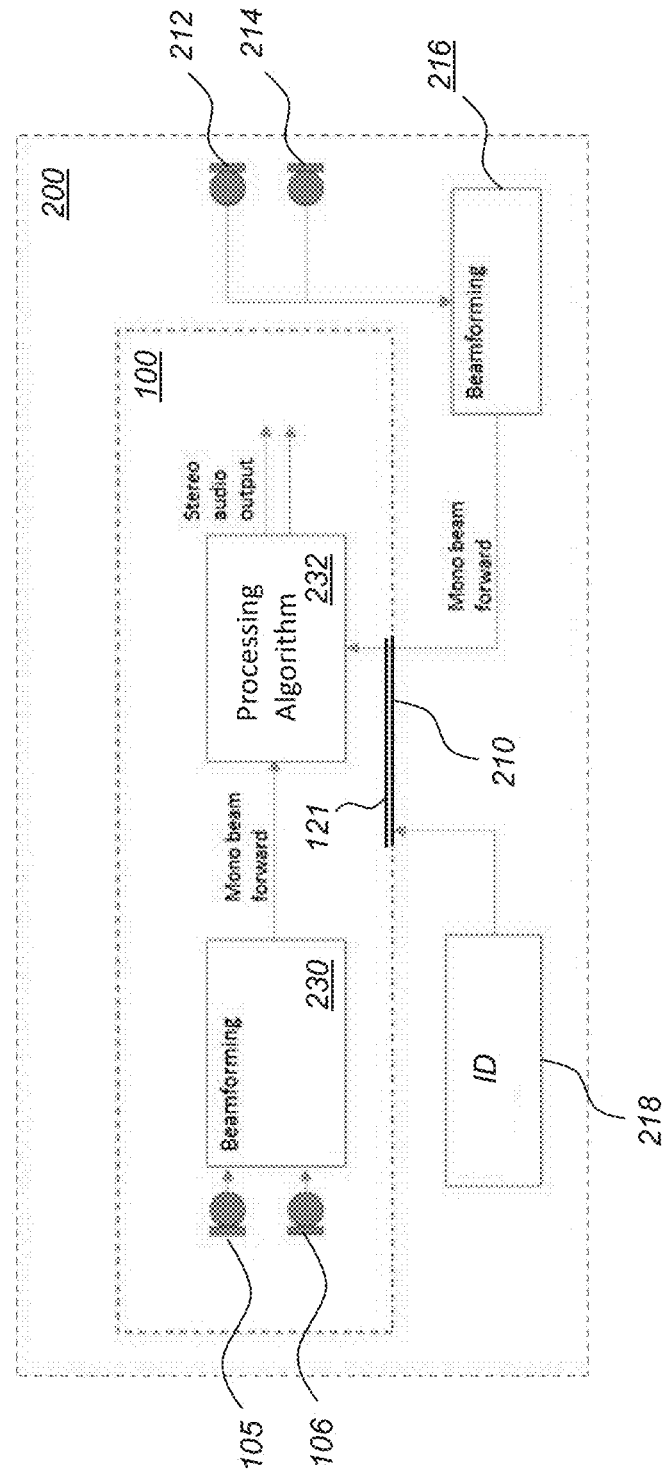
FIG. 5 is a schematic diagram of components of the terminal and cover accessory, when attached, in accordance with one embodiment.

Referring now to FIG. 5, a schematic block diagram showing signal and processing blocks of the terminal 100 when attached to the cover 200 is shown.

In this embodiment, audio signal processing is shared, or divided, between the terminal 100 and the cover 200. In the terminal 100, local microphones 105, 106 are processed by a first stage, beamforming algorithm 230, using either the software 128 or firmware, to provide a monaural signal. This is a limitation of the terminal 100 with its two, front-mounted microphones 104, 106. In the cover 200, external microphones 212, 214 are similarly processed using the same or similar beamforming algorithm 216, and the resulting monaural signal is transmitted via the interface (the docking connector 210 to port 121) to the controller 106. Also transmitted to the controller is the identifier 218 for the cover 200. The software application 128 identifies, based on the identifier 218, that the resulting, pre-processed monaural signal from the cover 200 results from two rearwardly facing microphones 212, 214 relative to the terminal's front microphones 105, 106. Accordingly, in this case, it selects an audio processing algorithm to generate required audio output data. This required audio output data can be a default, or user-selected via an application. In this example, the audio processing algorithm selected, indicated as reference numeral 232, generates a stereo signal from the front and rear monaural channels, with greater emphasis placed on the front channel.

The resulting stereo audio data can be played through a loudspeaker, output to external devices, or stored for later use. Examples of the above audio processing algorithms are described in US 2016/0044410 A1, the contents of which are incorporated herein by reference.

It will be appreciated that more complex or sophisticated algorithms may be used, depending on number and spatial location(s) of the external microphone(s), their location relative to the terminal microphones 105, 106, and/or based on other attributes of the cover 200. Other algorithms may perform audio processing functions such as, but not limited to, inhibiting audio from one or more local and/or external microphone(s), amplifying or attenuating one relative to the other, switching between local and external microphone(s), using the audio from the local microphone(s) as a primary audio source and the audio from the external microphone(s) for noise cancellation, or vice-versa, or for high amplitude audio capture, such as described in U.S. Pat. No. 8,233,637 the contents of which are incorporated herein by reference.

Figure 6:
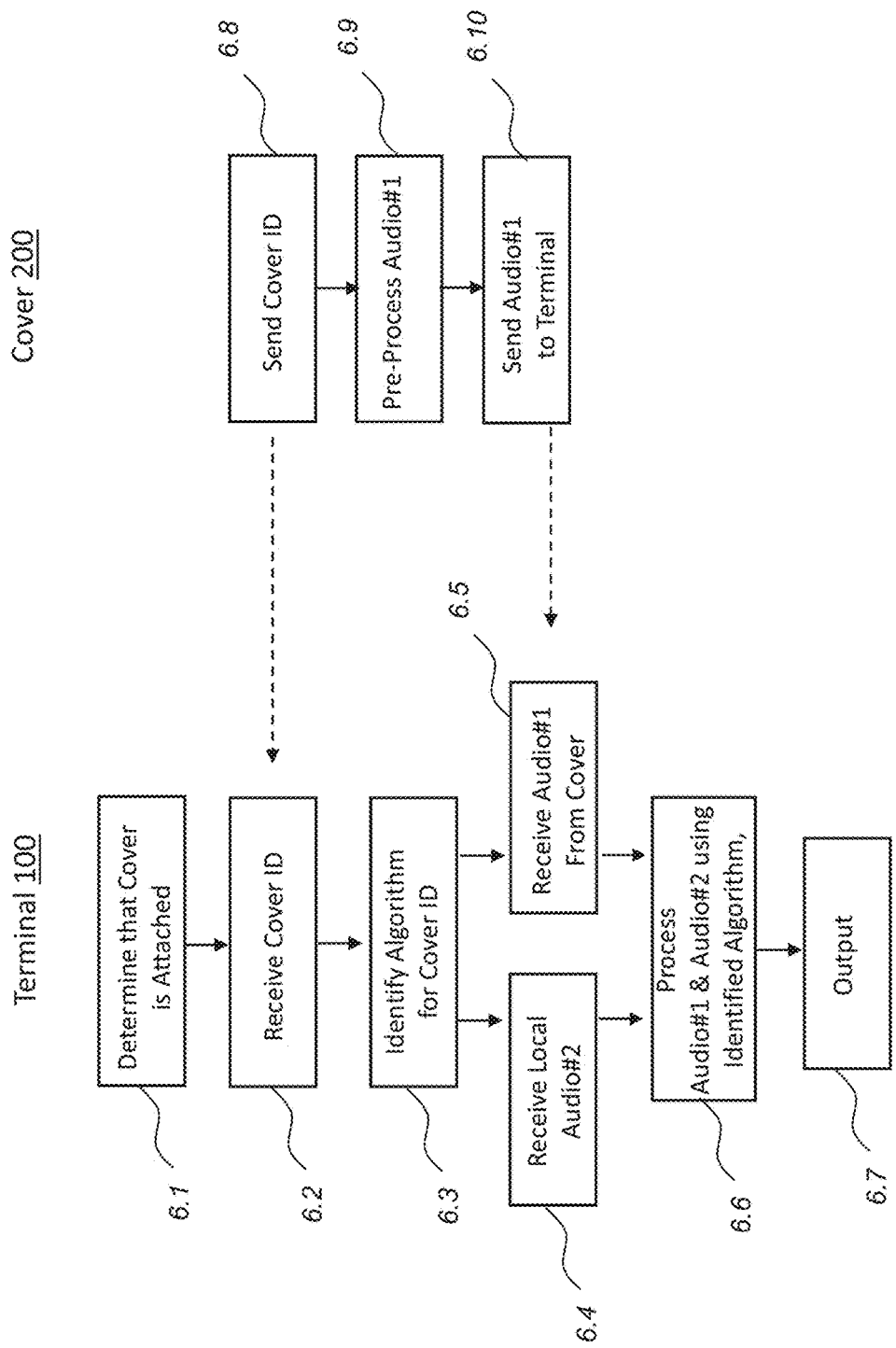
FIG. 6 is a flow diagram illustrating method steps performed in the FIG. 5 embodiment.

The flow chart of FIG. 6 shows the main processing steps performed in the terminal 100 and the cover 200. Each processing flow will be described separately.

In step 6.1 the terminal 100 determines that a cover 200 is attached. In step 6.2 the terminal receives or reads the cover identifier. In step 6.3, the terminal 100 accesses a database storing plural sets of audio processing algorithms assigned to different cover identifiers. The appropriate audio processing algorithm is identified. In respective steps 6.4 and 6.5 the local audio signal is received from the local microphones, and external audio is received from the cover 200. The two audio signals or streams are then processed in step 6.6 in accordance with the identified algorithm, and then output in step 6.7.

In the cover 200, its initial step 6.8 is to send the cover identifier to the terminal 100. The cover 200 pre-processes the local audio signal or stream in step 6.9 and in step 6.10 sends it to the terminal 100.

The respective steps represent data operating tasks that may be performed under controller or processor control, and the steps can be implemented using software stored on a non-transient medium. Alternatively, a microcontroller or ASIC may be used. The order of certain steps can be changed.

Second Embodiment

Figure 7:
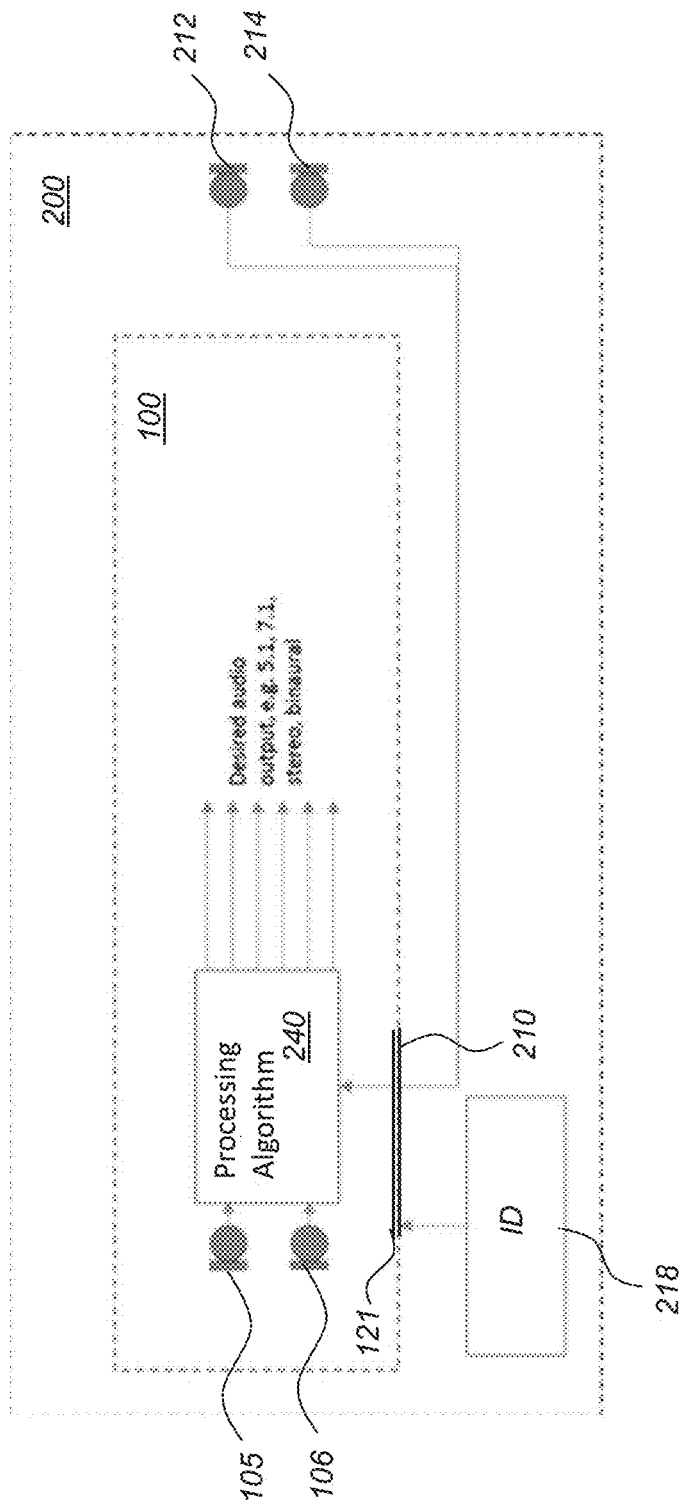
FIG. 7 is a schematic diagram of components of the terminal and cover accessory, when attached, in accordance with a second embodiment.

Referring to FIG. 7, in this embodiment, which is similar to the first embodiment, the cover 200 performs no pre-processing of audio signals from the external microphones 212, 214. Rather, the cover 200 sends the audio signals directly from the microphones 212, 214 to the terminal 100 through the interface. As in the first embodiment, the cover identifier 218 is sent through the interface and received by the processor 106 of the terminal 100 for identifying the cover 200 and therefore the appropriate audio processing algorithm 240.

The selected audio processing algorithm 240 in this case takes the two external microphone signals and the two local microphone signals and processes these to generate a desired audio output signal, which can be one or more of binaural, stereo, 5.1, 7.1, etc. A suitable algorithm for element 240 is described in US 20130044884 the contents of which are incorporated herein by reference.

Figure 8:
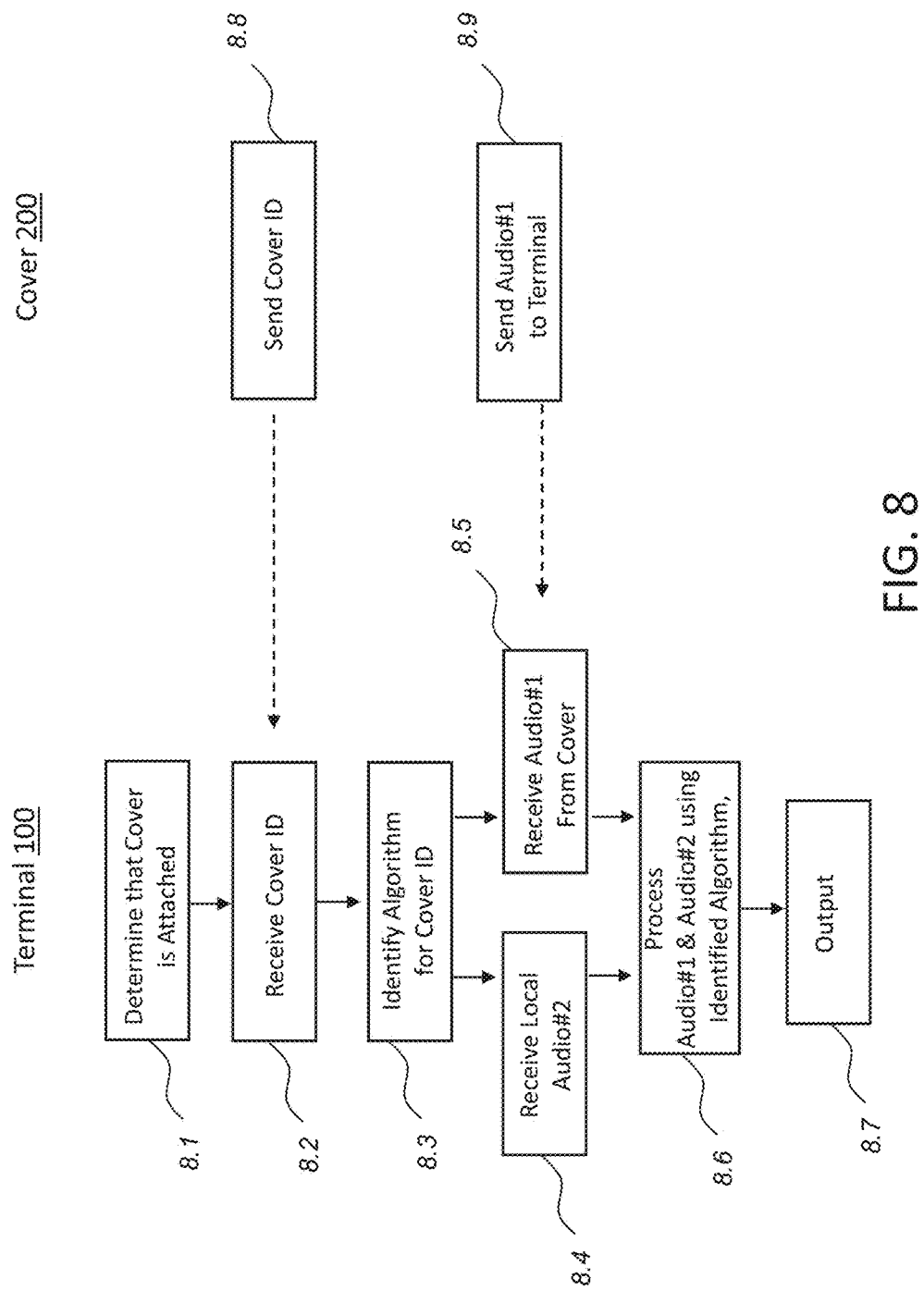
FIG. 8 is a flow diagram illustrating method steps performed in the FIG. 7 embodiment.

The flow chart of FIG. 8 shows the main processing steps performed in the terminal 100 and the cover 200. Each processing flow will be described separately.

In step 8.1 the terminal 100 determines that a cover 200 is attached. In step 8.2 the terminal receives or reads the cover identifier. In step 8.3, the terminal 100 accesses a database storing plural sets of audio processing algorithms assigned to different cover identifiers. The appropriate audio processing algorithm is identified. In respective steps 8.4 and 8.5 the local audio signal is received from the local microphones, and external audio is received from the cover 200 without pre-processing (it is received directly or indirectly from the cover microphones). The two audio signals or streams are then processed in step 8.6 in accordance with the identified algorithm, and then output in step 8.7.

In the cover 200, its initial step 8.8 is to send the cover identifier to the terminal 100. The cover 200 sends the local audio signal or stream in step 8.9 to the terminal 100.

The respective steps represent data operating tasks that may be performed under controller or processor control, and the steps can be implemented using software stored on a non-transient medium. Alternatively, a microcontroller or ASIC may be used. The order of certain steps can be changed.

Third Embodiment

Figure 9:
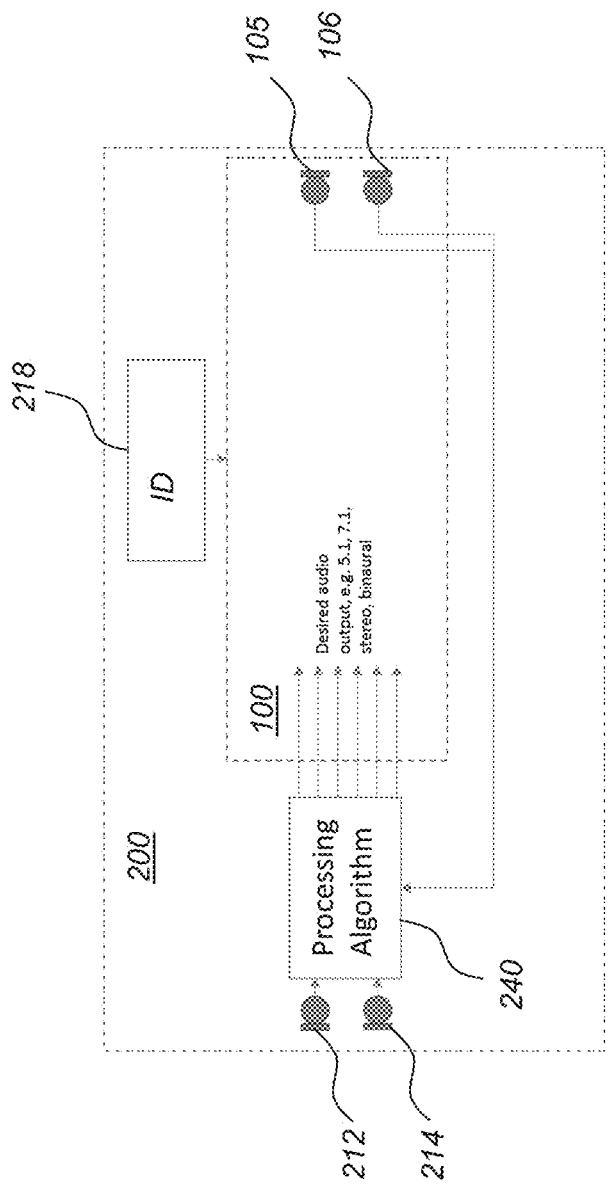
FIG. 9 is a schematic diagram of components of the terminal and cover accessory, when attached, in accordance with a third embodiment.

Referring to FIG. 9, this embodiment, which is similar to the first and second embodiments, is appropriate where the terminal 100 may not possess sufficient processing capabilities for required audio processing. In this embodiment, therefore, audio signal processing is performed by the processor 216 of the cover 200, rather than in the terminal 100. In this case, the audio signals from the local microphones 105, 106 are sent directly to the processor 216 of cover 200 through the interface.

At said processor 216, the required audio processing algorithm, in this case the same algorithm employed in the second embodiment, is performed on the four audio signals. The algorithm is pre-loaded in memory on the cover 200. The resulting, processed audio signal data is transmitted back to the terminal 100 through the interface. The cover 200 may nevertheless still send its identifier 218 to the terminal 100 to permit some post-processing of the received audio output signal, which can be one or more of binaural, stereo, 5.1, 7.1, etc.

Figure 10:
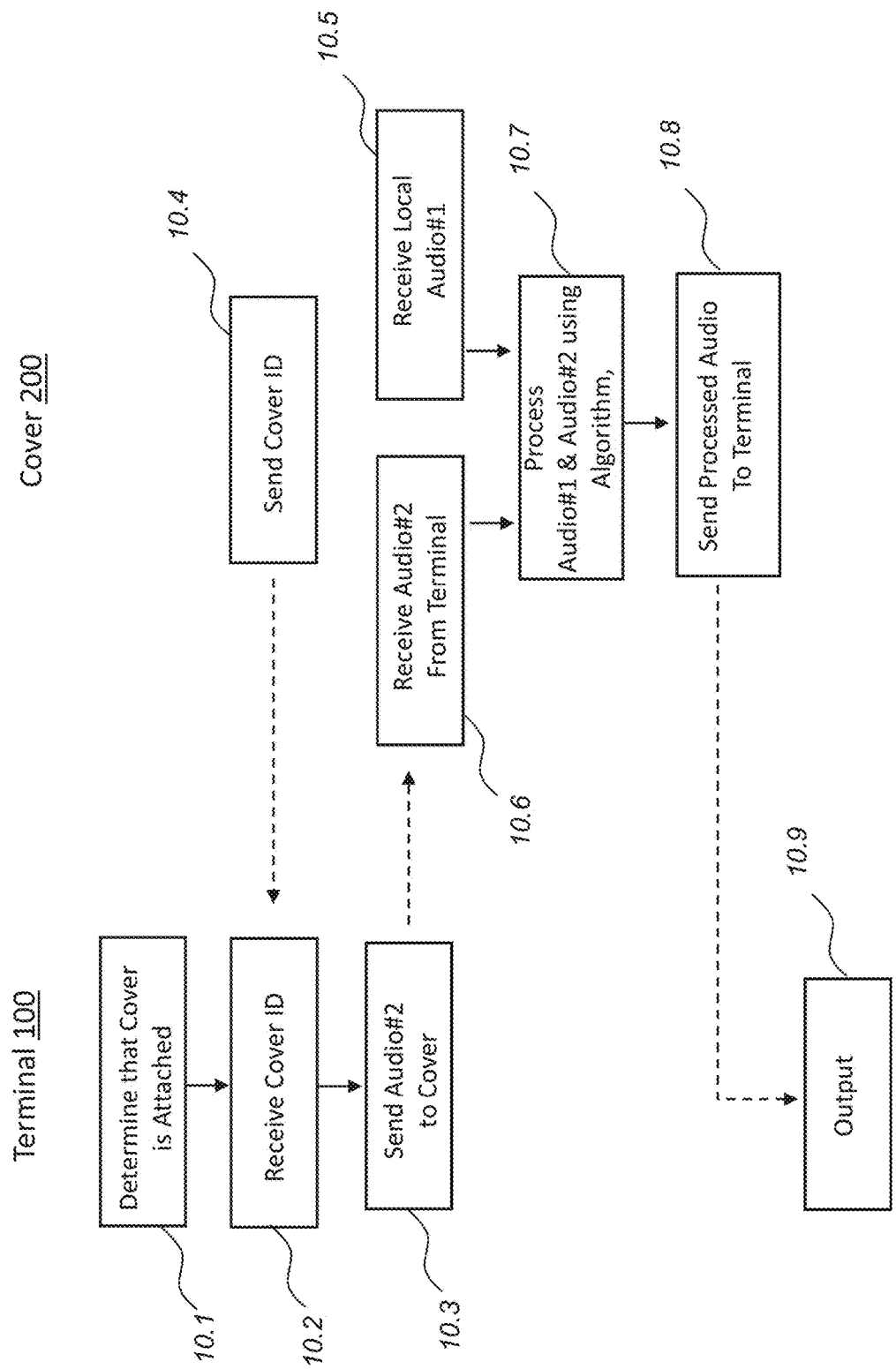
FIG. 10 is a flow diagram illustrating method steps performed in the FIG. 9 embodiment.

The flow chart of FIG. 10 shows the main processing steps performed in the terminal 100 and the cover 200. Each processing flow will be described separately.

In step 10.1 the terminal 100 determines that a cover 200 is attached, for example by receiving and reading the cover identifier as instep 10.2. In step 10.3, responsive thereto, the terminal 100 sends its local audio stream to the cover 200 for processing. In step 10.4 the processed audio signals or stream is output.

In the cover 200, its initial step 10.4 is to send the cover identifier to the terminal 100. In respective steps 10.5, 10.6 the local audio stream and the audio stream from the terminal 100 is received. In step 10.7 the two audio signals or streams are processed. In step 10.8, the processed audio signals or stream is sent to the terminal 100.

The respective steps represent data operating tasks that may be performed under controller or processor control, and the steps can be implemented using software stored on a non-transient medium. Alternatively, a microcontroller or ASIC may be used. The order of certain steps can be changed.

Fourth Embodiment

Figure 11:
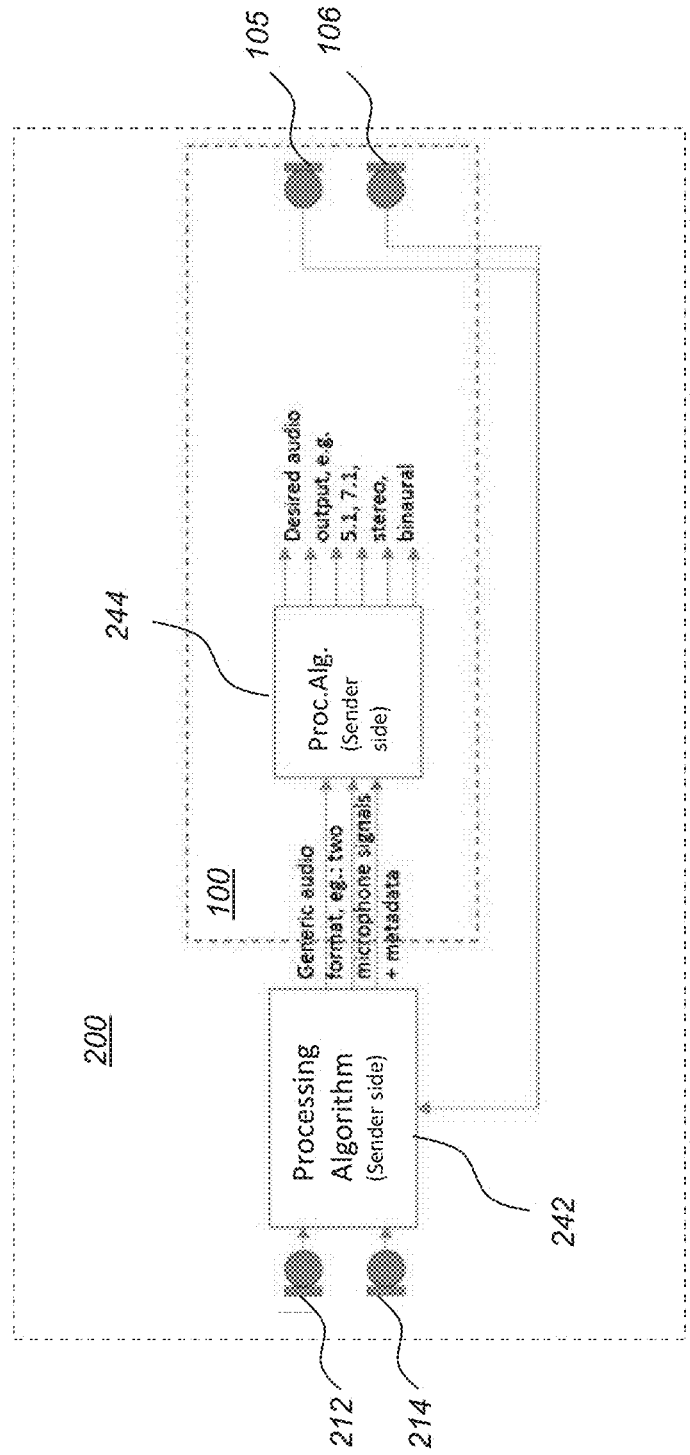
FIG. 11 is a schematic diagram of components of the terminal and cover accessory, when attached, in accordance with a fourth embodiment.

Referring to FIG. 11, this embodiment is a modification of the third embodiment whereby audio signal processing is performed in the cover, using the processor 216. In this case, the audio processing algorithm 242 is arranged to convert the audio signals into a generic format. An example of this has been described in U.S. Pat. No. 9,055,371 B1, the contents of which are incorporated herein by reference, but it could also generate the four signals (W, X, Y, Z) in the Ambisonics™ surround sound technique.

At the terminal 100, the received generic format signals are made available for use, being supplied to the processor 106 e.g. for playback with post-processing at element 244 to transform the signal into an appropriate format, e.g. for headphone listening it will be binaural.

In this embodiment, it is not necessary for the cover 200 to send its identifier to the terminal 100. Metadata transmitted with the generic format signals include all required information for rendering the audio into different output formats.

Figure 12:
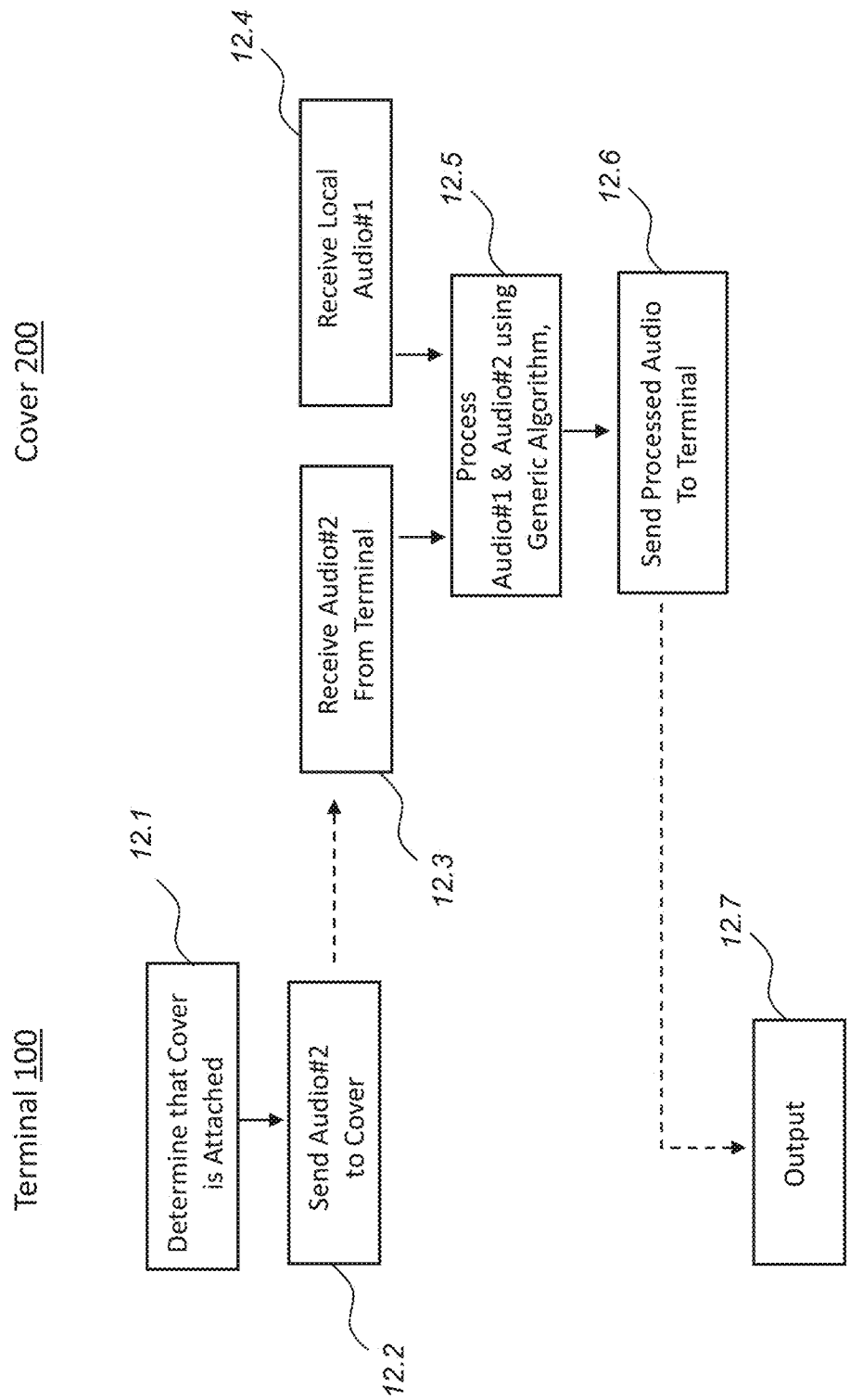
FIG. 12 is a flow diagram illustrating method steps performed in the FIG. 11 embodiment.

The flow chart of FIG. 12 shows the main processing steps performed in the terminal 100 and the cover 200. Each processing flow will be described separately.

In step 12.1 the terminal 100 determines that a cover 200 is attached. In step 12.2, the terminal 100 sends its local audio stream to the cover 200 for processing. In step 12.7 the processed audio signals or stream is output, or may transform the signals into a desired format using optional post-processing.

In the cover 200, its initial steps 12.3, 12.4 take the audio stream from the terminal 100 and the local audio stream. In step 12.5 the two audio signals or streams are processed. In step 12.6, the processed audio signals or stream is sent to the terminal 100.

The respective steps represent data operating tasks that may be performed under controller or processor control, and the steps can be implemented using software stored on a non-transient medium. Alternatively, a microcontroller or ASIC may be used. The order of certain steps can be changed.

The following additional, optional features or functionality are applicable to all above embodiments. First, whilst the cover 200 employs additional microphones, these could be replaced by loudspeakers, so that a terminal 100 having only one loudspeaker may add stereo playback with another loudspeaker in the cover. Further, the external microphones 105, 106 may be placed optimally so that they work efficiently with the terminal 100. They may be mounted on the same plane or the same axis/line, which is effective with certain beamforming algorithms. In some embodiments, the terminal 100 may comprise a large number of local microphones with a particular geometric layout; this layout is likely to be appropriate for some algorithms, but not for others. For example, a layout that is appropriate for adaptive beamforming in hands-free telephony may not be appropriate for other uses. By providing a cover with a more appropriate layout for a particular use, and applying an algorithm for that use upon detecting said cover, it is possible to provide efficient functionality for different algorithms and uses.

In some embodiments, the external microphones 212, 214 are high-quality microphones relative to the local microphones 105, 106 provided on the terminal 100. For example, they may have a higher dynamic range and/or may be able to handle higher sound pressures. Said external microphones 212, 214 may be located at positions corresponding to those of the local microphones 105, 106. This may result in the external microphones 212, 214 overlying the local microphones 105, 106 and therefore effectively replacing them in use with higher quality audio capture; alternatively, they may be on the opposite side of the terminal 100 but in alignment with the local microphones.

In some embodiments, the audio processing algorithms may switch between microphones 105, 106, 212, 214 dependent on the detection of distortion or other predetermined artefacts in the captured sound. For example, detection of audio saturation, muffling, and/or levels of noise exceeding a predetermined level may cause one set of microphones, e.g. one or more of the local microphones 105, 106 to be disabled (or have their captured signals attenuated) and the external microphones 212, 214 enabled or greater emphasis placed on their captured signals.

Switching can also be caused manually by user input, e.g. through a button or switch or the graphical user interface on the terminal. User input generates a control input that effects switching or indeed any other form of audio processing control.

In all cases, upon detecting mechanical attachment of the cover 200 to the terminal 100 the appropriate audio processing algorithm is initiated, which itself may change during use, for example in the presence of detected distortion, unwanted artefacts and/or switching.

Fifth Embodiment

A fifth embodiment will now be described which seeks to alleviate, in particular, problems encountered with audio processing algorithms due to the size of terminal. More specifically, the trend towards thinner terminals (measured front to back) brings front and rear mounted microphones closer together, the resulting signal characteristics of which can cause problems.

Figure 13:
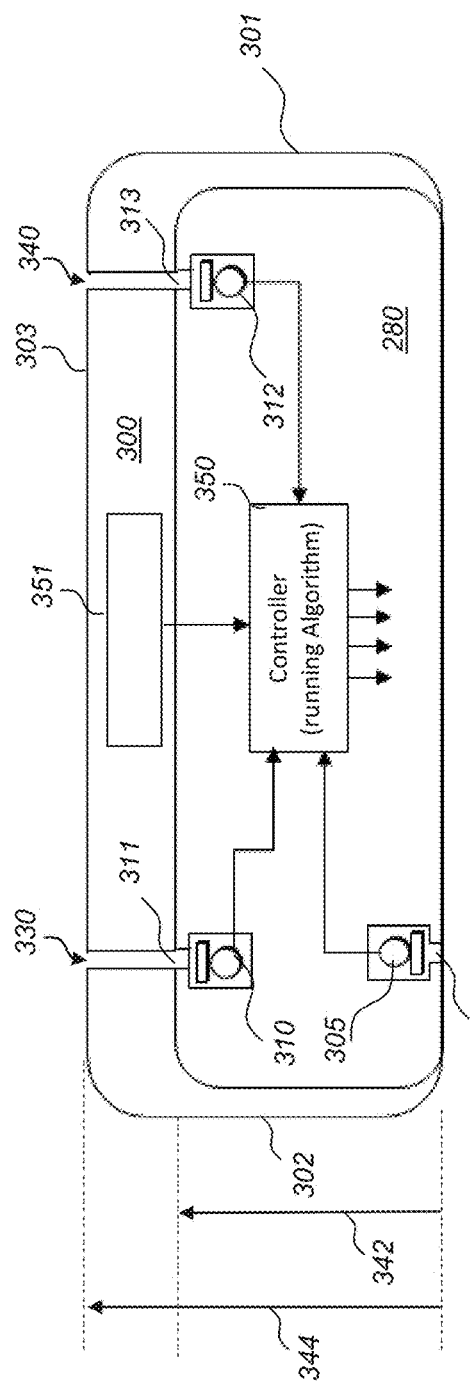
FIG. 13 is a schematic, sectional diagram of a terminal when connected to a cover, in accordance with a fifth embodiment.

Referring to FIG. 13, which is a schematic, side-sectional view of a terminal 280 connected within a cover 300, the cover is dimensioned and arranged to increase the effective pick-up distance between front and back microphones. The cover 300 is similar in form to the cover 200 shown in FIG. 3, having four peripheral edge walls 301 and a rear wall 303 leaving the front area of the terminal 280 exposed for user operation. The rear wall 303 is thicker, however. In this example, three microphones 307, 310, 317 are provided on the terminal. One microphone 307 is provided to the front, recessed beneath a surface aperture 307. Two spaced-apart microphones 310, 317 are provided to the rear, recessed beneath respective surface apertures 311, 313.

The terminal 280 itself comprises the functional components shown in FIG. 2, save for their being three microphones 307, 310, 317 instead of two. A controller thereof is represented by reference numeral 350 in FIG. 13, but it is otherwise configured to operate in the same way as previous embodiments, under software control, to perform audio processing using any one of the aforementioned methods and algorithms.

The cover 300 is arranged with first and second apertures 330, 340 provided through the rear wall 303 at respective locations which overlie the rear microphones 310, 317. The thickness of the rear wall 303, and the apertures 330, 340, increase the effective distance between the pick-up of the front microphone 305 and those of the rear microphones 310, 317. Reference numeral 342 indicates the original distance, and reference numeral 344 the modified distance due to the cover 300.

Modification of the distance will require modification of one or more audio processing algorithms that the controller 350 may run. For this purpose a dedicated application program is provided on memory of the terminal 280 which, in a manner similar to the above, takes an identifier unique to the cover type, and determines which modifier to apply to the algorithm. In alternative embodiments, the modifier may be supplied directly.

The identifier or modifier, represented schematically as element 351, can be transferred from the cover 300 to the controller 350 using a number of methods. For example, an electrical or electronic connector (such as the docking connector 210) can make contact with a corresponding connector of the terminal 280 to form a physical link over which the identifier can be sent. Alternatively, or additionally, a wireless connection can be made between the cover 300 and the controller 350, e.g. using WiFi or Bluetooth™.

In one embodiment, the cover 300 provides a Bluetooth™ LE tracker tag, such tags having a relatively long life before recharging is needed.

Alternatively, or additionally, a form of signal recognition may be employed. In this regard, the cover apertures 330, 340 will result in a recognisable peak to their associated microphone's frequency response; the controller 350 can detect the peak by analysing long-term averages of recorded microphone signals. The frequency of the peak maximum is recognised by the controller by checking for the maximum energy frequency region from microphone signal frequency responses, and based on detecting a particular 'signature' the case type is identified.

Alternatively, or additionally, a mechanical connection system can be employed whereby the cover 300 has a fixed part that contacts a button or lever on the terminal 280. Depending on the position of the button or lever, the cover 300 can be recognised.

In this embodiment (and indeed with all embodiments) software updates can provide one or both terminals 100, 350 with updated data for identifying attributes of covers and/or their identifiers and/or for updating audio processing algorithms. Indeed, with knowledge of a currently-used terminal and cover pairing, new audio processing algorithms can be downloaded on-the-fly or periodically to cater for the established pairing.

Typically, the longer the aperture 330, 340, the further away the effective pick-up of the microphone 310, 317 becomes. The profile of the apertures 330, 340, which may be tubular, will have an effect on the microphone signals, and so need to be designed so that they do not change the frequency response significantly. One option is to make the diameter or width of the tubes wider, or for the algorithm to apply cover-dependent equalisation to the resulting signals.

Figure 14:
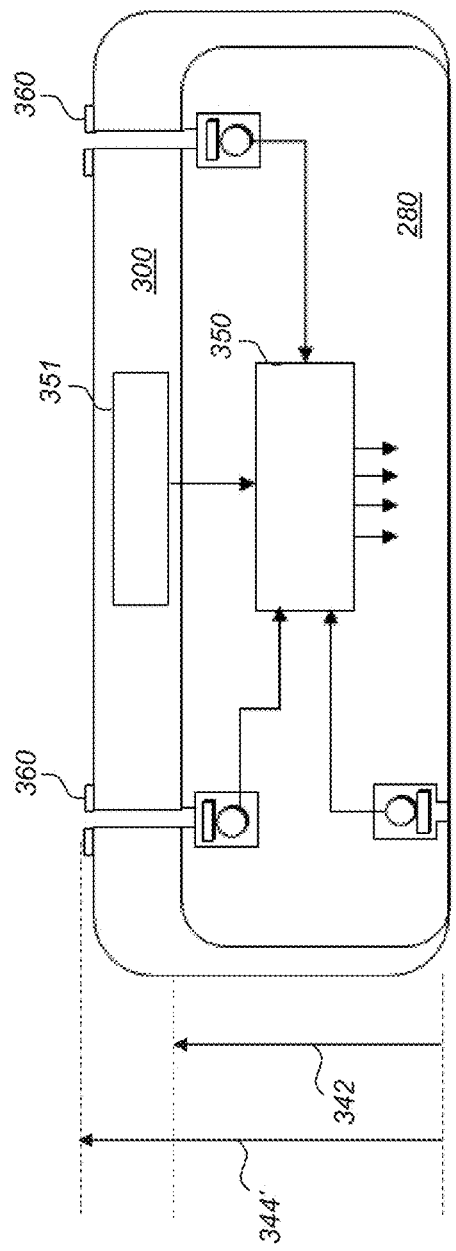
FIG. 14 shows a modified version of the FIG. 13 embodiment, in which the cover is modified.
Figure 15:
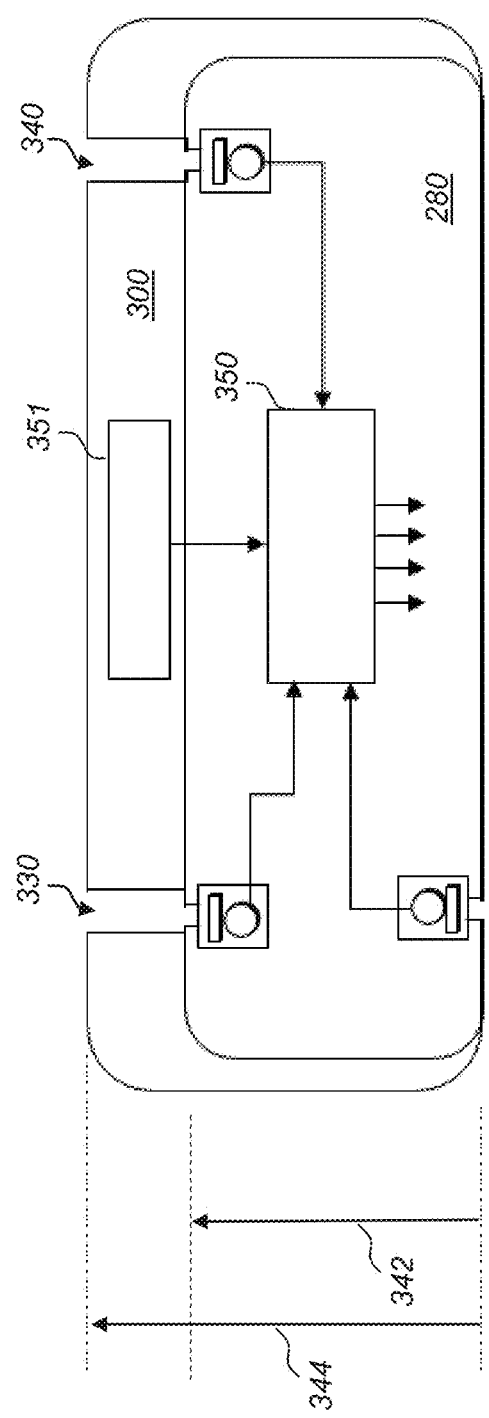
FIG. 15 shows a modified version of the FIGS. 13 and 14 embodiments, in which the cover is further modified.

Referring to FIG. 14, the effective distance between the microphones 310, 317 can be extended further by adding additional thickness by means of a projecting wall 360 around the apertures 330, 340. However, if too thick, the microphone frequency response may change in an unwanted way. Accordingly, it is found that making the apertures 330, 340 wider can counteract the effect of deep apertures, in particular wider than the corresponding apertures 311, 313 on the terminal 280. This can be seen in FIG. 15, for example. Again, this form of cover will require an update to the audio processing algorithm in accordance with receiving the identification of the cover type.

Sixth Embodiment

In this embodiment, the relative position/orientation of a terminal 400 and its attached cover 450 can assume one of a number of possible configurations. Three such configurations are shown by way of example in FIGS. 16(*a*), 16(*b*) and 16(*c*).

Figure 16A:
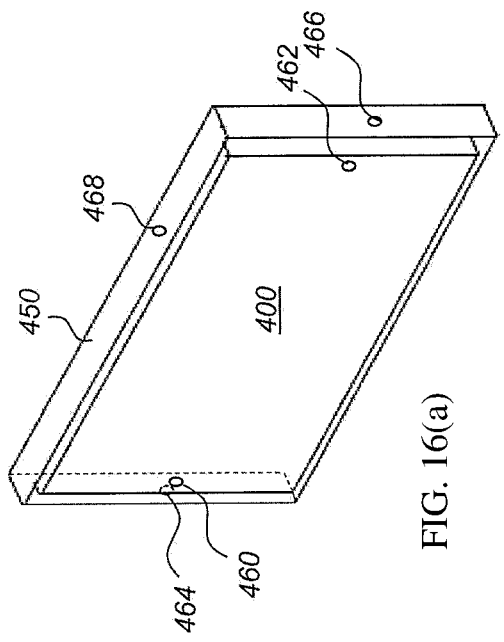
FIGS. 16(a), 16(b) and FIG. 16(c) are schematic views of a terminal when connected to a cover in three respective configurations, in accordance with a sixth embodiment.
Figure 16B:
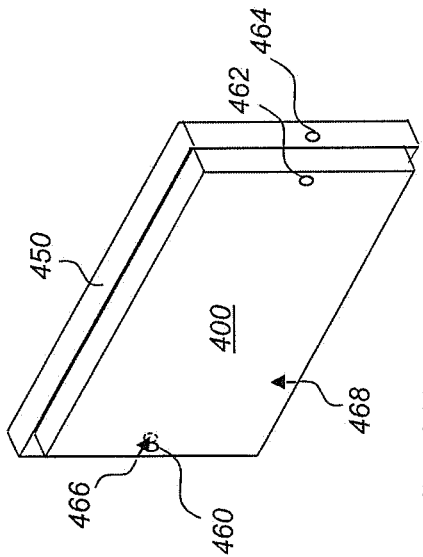
Figure 16C:
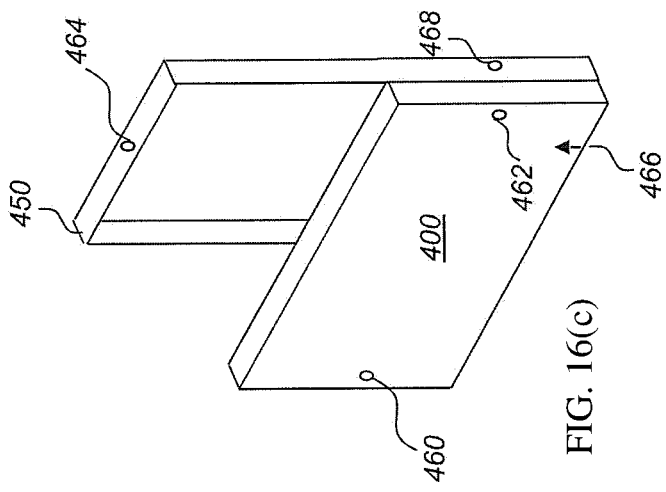

In the situation where the terminal 400 and the cover 450 both have microphones, the different configurations may optimise or improve microphone combinations for different application uses. In FIGS. 16(*a*), 16(*b*) and 16(*c*), the terminal 400 has two front-mounted microphones 460, 462 located near opposite ends of its front side. The cover 450 has three microphones 464, 466, 468 on three respective peripheral edges.

Referring to FIG. 16(*a*), in a first configuration, the cover 450 nests over the terminal 400 to optimise overall size. Because the overall depth or thickness of the covered terminal 400 is quite small, and also because the cover 450 may overlap the terminal's microphones, only microphones 464, 466, 468 on the cover are employed in this configuration, making it best suited for telecommunications and/or stereo recording. This orientation can be detected by a processor of the terminal 400 by comparing signals between at least one of the terminal microphones 460, 462 and at least one of the cover microphones 464, 466, 468. For example, if the correlation between microphone 460 and microphone 464, and the correlation between microphone 462 and microphone 466 are both over a predetermined threshold, then this configuration is detected and appropriate audio signal processing used.

Referring to FIG. 16(*b*), in a second configuration when the cover 450 is rotated 180 degrees, the cover 450 does not fit so tightly and the overall depth or thickness is increased. The positions of the microphones 460, 462, 464, 462 are now optimised for binaural or 5.1 recording. This orientation can be detected by the processor of terminal 400 comparing signals as above. Specifically, if the correlation between microphone 464 and microphone 462, and the correlation between microphone 460 and microphone 466 are both above a predetermined threshold, then this configuration is detected and appropriate audio signal processing used.

Referring to FIG. 16(*c*), in a third configuration when the cover 450 is rotated 90 degrees relative to the terminal 400, one of the cover microphones 464 is some way above the others. In this way, an algorithm can be extended to detect directions above and below the device which enables detecting sounds from all directions and recording good quality audio for, for example, virtual reality use. This orientation can be detected by the processor of terminal 400 comparing signals as above. Specifically, if the correlation between microphone 462 and microphone 468 is above a predetermined threshold, and if the correlation between the other microphone pairs is below the threshold, then this configuration is detected and appropriate audio signal processing used.

It will be appreciated that the above described embodiments are purely illustrative and are not limiting on the scope of the invention. Other variations and modifications will be apparent to persons skilled in the art upon reading the present application.

For example, instead of the 'external' microphones 212, 214 being provided on the body of the cover 200 spaced apart on the rear wall 202 at opposite sides, they may be in any form of array. For example, there could be three microphones located spaced from each other on different edges of the body of the cover 200. Alternatively, there may be four or more microphones arranged in an array. For example, whilst signal communications between the terminal 100 and the cover 200 can be performed through engagement of the port 121 to the docking connector 210, any means of conductive connection between the terminal 100 and cover 200 can be used. Transmission of the cover identifier to the terminal 100, for example, may be performed over a different link than transmission of audio signals. The cover identifier may be transmitted through a different conductive link or even wirelessly.

Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

The invention claimed is:

1. Apparatus comprising:
   one or more first microphones for providing audio signals from captured acoustic signals;

one or more conductive terminals for connection to one or more conductive terminals of an external cover device for receiving audio signals provided by one or more second microphones included with the external cover device; and one or more processors coupled to the one or more first microphones and to the one or more conductive terminals and configured to perform audio processing on the audio signals from the one or more first microphones and/or from the one or more second microphones based on a control input, wherein the control input is provided in response to identifying, by the one or more processors, the connection of the external cover device, wherein the one or more processors is configured to perform audio processing on the audio signals at least from the one or more second microphones included with the external cover device based on the control input when the audio signals from the one or more second microphones are to be processed.

2. The apparatus according to claim 1, wherein the control input comprises a user control input provided through a user interface of the apparatus.

3. The apparatus according to claim 1, wherein the control input is provided by the one or more processors responsive to identifying, by the one or more processors, distortion in the audio signals provided by the one or more first microphones and/or the one or more second microphones.

4. The apparatus according to claim 3, wherein the one or more processors is configured to be responsive to receiving the control input to disable or attenuate the audio signals provided from the one or more first and/or second microphones which produce the distortion and to enable or amplify audio signals from the other.

5. The apparatus according to claim 1, wherein the one or more processors is configured to perform audio processing on the audio signals dependent on physical attributes of the external cover device.

6. The apparatus according to claim 5, wherein the one or more processors is configured to identify physical attributes of the external cover device by means of signal analysis of the audio signals received from either or both of the one or more first and second microphones.

7. The apparatus according to claim 1, wherein the one or more processors is configured to identify the external cover device by receiving an identifier from the external cover device.

8. The apparatus according to claim 1, further comprising a memory storing plural sets of cover device identifiers in correspondence to plural audio processing algorithms, and wherein the one or more processors are configured to perform audio processing on the audio signals using one or more of the algorithms which correspond to the identified external cover device.

9. The apparatus according to claim 1, wherein the one or more processors is configured to process the audio signals received from the one or more first microphones differently from the audio signals received from the one or more second microphones.

10. The apparatus according to claim 9, wherein the one or more processors is configured to amplify or attenuate the audio signals received from the one or more first microphones relative to the audio signals received from the one or more second microphones.

11. The apparatus according to claim 9, wherein the one or more processors is configured to process at least one of the audio signals from the one or more first and second microphones as a primary audio signal and at least the other one as a noise-cancelling signal.

12. The apparatus according to claim 1, wherein the one or more processors is configured to modify one or both of the audio signals from the one or more first microphones and the audio signals from the one or more second microphones dependent on their relative positions to each other.

13. The apparatus according to claim 1, wherein the apparatus comprises a mobile telephone or tablet computer.

14. A cover apparatus for a removable attachment to the apparatus of claim 1, the cover apparatus comprising the one or more second microphones and connecting to the apparatus via the one or more conductive terminals for providing audio signals provided by said one or more second microphones to the apparatus, wherein the cover apparatus comprises the external cover device.

15. The cover apparatus according to claim 14, comprising a rear wall and one or more perimeter walls upstanding from the rear wall for mechanical attachment to the apparatus, wherein the one or more second microphones of the cover apparatus are carried by the rear wall.

16. The cover apparatus according to claim 14, wherein at least one additional processor associated with the cover apparatus is further configured to store and transmit to the apparatus data indicative of an identity of the cover apparatus or attributes of the cover apparatus.

17. An apparatus comprising:
a cover for a removable attachment to the exterior of an electronic apparatus;
one or more microphones on the cover for providing audio signals from captured acoustic signals;
one or more conductive terminals on the cover for connection to one or more conductive terminals of the electronic apparatus for providing audio signals provided by the one or more microphones to the electronic apparatus; and
one or more processors configured to receive audio signals from the electronic apparatus and to perform audio processing on said audio signals from the electronic apparatus and audio from the one or more microphones on the cover.

18. An apparatus comprising:
one or more first microphones for providing audio signals from captured acoustic signals;
one or more conductive terminals for connection to one or more conductive terminals of an external cover device for receiving audio signals provided by one or more second microphones included with the external cover device;
one or more processors coupled to the one or more first microphones and to the one or more conductive terminals; and
one or more memories having stored non-transiently therein machine-readable instructions that when executed by the one or more processors cause the one or more processors to perform audio processing on the audio signals from the one or more first microphones and/or from the one or more second microphones based on a control input, wherein the control input is provided in response to identifying, by the one or more processors, the connection of the external cover device, wherein the one or more processors is configured to perform audio processing on the audio signals at least from the one or more second microphones included with the external cover device based on the control input when the audio signals from the one or more second microphones are to be processed.

19. The apparatus according to claim 18, wherein the control input comprises a user control input provided through a user interface of the apparatus.

20. The apparatus according to claim 18 wherein the control input is provided by the one or more processors responsive to identifying, by the one or more processors, distortion in the audio signals provided by the one or more first microphones and/or the one or more second microphones.

\* \* \* \* \*